United States Patent [19]
Tomioka

[11] Patent Number: 5,343,062
[45] Date of Patent: Aug. 30, 1994

[54] SEMICONDUCTOR MEMORY HAVING A MEMORY CELL INCLUDING A CAPACITOR WITH A TWO-LAYER LOWER ELECTRODE

[75] Inventor: Yugo Tomioka, Tokyo, Japan

[73] Assignee: Nippon Steel Corporation, Tokyo, Japan

[21] Appl. No.: 67,101

[22] Filed: May 26, 1993

[30] Foreign Application Priority Data

May 29, 1992 [JP] Japan ................... 4-164056

[51] Int. Cl.$^5$ ............... H01L 29/68; H01L 29/78; H01L 29/92
[52] U.S. Cl. .................. 257/297; 257/296; 257/607
[58] Field of Search ........... 257/296, 306, 309, 300, 257/301, 303, 297, 607

[56] References Cited

U.S. PATENT DOCUMENTS 5,017,982  5/1991  Kobayashi ............. 257/306
5,101,251  3/1992  Wakamiya et al. ........ 257/296

FOREIGN PATENT DOCUMENTS 3-44068  2/1991  Japan .

Primary Examiner—Ngan V. Ngo
Attorney, Agent, or Firm—Pollock, Vande Sande & Priddy

[57] ABSTRACT

A semiconductor memory having a memory cell including a stacked capacitor in which a lower electrode contacting one of two diffusion regions of an access transistor is formed in the form of two layers. It is preferable that impurities having a smaller diffusion coefficient, or arsenic is introduced into a first layer of the lower electrode contacting the diffusion region, and impurities having a larger diffusion coefficient, or phosphorus is introduced into a second layer of the lower electrode contacting capacitor dielectric film. Since a diffusion coefficient of arsenic is small, it is possible to prevent the junction of the diffusion region from becoming deep and on the other hand since phosphorus is introduced into the second polycrystalline Si film contacting the capacitor dielectric film, it is possible to prevent the degradation of the film quality of the capacitor dielectric film.

10 Claims, 6 Drawing Sheets

SEMICONDUCTOR MEMORY HAVING A MEMORY CELL INCLUDING A CAPACITOR WITH A TWO-LAYER LOWER ELECTRODE

FIELD OF THE INVENTION

The present invention relates to a method of manufacturing a semiconductor memory such as stacked capacitor DRAM.

BACKGROUND OF THE INVENTION

A lower electrode of a capacitor, which contacts a drain or a source of an access transistor in the prior art stacked capacitor DRAM, is formed in the form of one layer.

FIG. 3 is a cross sectional view showing a structure of a memory cell of the prior art stacked capacitor DRAM. In order to manufacture the memory cell of DRAM, an $SiO_2$ film 12 is selectively formed on a surface of a P type Si substrate 11 to form a field region, and then an $SiO_2$ film 13 is formed as a gate oxide film on a surface of an active region. Then, a polycide film 16 consisting of a polycrystalline Si film 14 and $WSi_x$ film 15 is formed on the $SiO_2$ films 13 and 12 by performing the patterning to form a gate electrode, i.e., a word line.

Next, ions of N type impurities are implanted into the active region at low concentration with the polycide film 16 and the $SiO_2$ film 12 as a mask, and then a sidewall of the polycide film 16 is formed of an $SiO_2$ film 17 or the like. Thereafter, ions of N type impurities are implanted into the active region at high concentration with the polycide film 16 and the $SiO_2$ films 12 and 17 as a mask to form diffusion regions 21 and 22. Up to this process, an access transistor 23 having a LDD (lightly doped drain) structure is formed.

Next, an interlayer insulating film 24 is formed on the whole surface of the substrate body, and then a contact hole 25 is formed through the interlayer insulating film 24 so as to reach the diffusion region 21. Then, a polycrystalline Si film 26 is deposited on the whole surface of the substrate body so as to contact the diffusion region 21 through the contact hole 25, and then N type impurities are introduced into the polycrystalline Si film 26. This introduction is performed by the ion implantation, the solid phase diffusion or the like. Thereafter, the polycrystalline Si film 26 is processed into a pattern of a lower electrode.

Next, a capacitor dielectric film 27 made of an insulating material such as an ONO film, and a polycrystalline Si film 31 are formed in this order on the whole surface of the substrate body, and then the impurities are introduced into the polycrystalline Si film 31. Thereafter, the polycrystalline Si film 31 is processed into a pattern of an upper electrode. Up to this process, a stacked capacitor 32 is formed.

Thereafter, an interlayer insulating film 33 is formed on the whole surface of the substrate body, and then a contact hole 34 is formed through the interlayer insulating films 33 and 34 so as to reach the diffusion region 22. Then, the patterning is performed to form a bit line (not shown) which contacts the diffusion region 22 through the contact hole 34, and then an over coat film and the like (not shown) are formed thereby to complete the stacked capacitor DRAM.

For example, Kobayashi discloses in JP-A-3-44068 stacked capacitor DRAM in which an electrode is formed into an irregular shape to increase the area of the electrode and to increase the capacitance of the capacitor. In this connection, the lower electrode of the stacked capacitor by Kobayashi is also made of a polysilicon film of one layer which was doped with phosphorus.

However, if phosphorus is employed as the N type impurities which are to be introduced into the polycrystalline Si film 26, since a diffusion coefficient of phosphorus is large, as shown in FIG. 2, the junction of the diffusion region 21 becomes deep. Thus, if the junction of the diffusion region 21 becomes deep, the resistance to the soft error due to the radiation of the $\alpha$-rays, and the characteristics of the access transistor 23 are degraded. On the other hand, if arsenic having a small diffusion coefficient is introduced into the polycrystalline Si film 26, the junction of the diffusion region 21 becomes shallow. However, it is well known that when arsenic is employed, the film quality of the capacitor dielectric film 27 formed on the polycrystalline Si film 26 is degraded.

That is, in the above-mentioned prior art structure, it is impossible to prevent the degradation of the film quality of the capacitor dielectric film 27 while preventing the degradation of the resistance to the soft error and the degradation of the characteristics of the access transistor 23.

SUMMARY OF THE INVENTION

It is therefore an object of the present invention to provide a semiconductor memory and a method of manufacturing the same which are capable of preventing the degradation of the resistance to the soft error and the degradation of the characteristics of the access transistor, and also preventing the degradation of the film quality of the capacitor dielectric film.

In order to solve the above-mentioned problems, according to the present invention, there is provided a semiconductor memory having a memory cell having a lower electrode including a transistor and a capacitor, including: a first semiconductor film in which a lower electrode of the capacitor contacts one of two diffusion regions of the transistor; and a second semiconductor film which is formed on the first semiconductor film, wherein first impurities of one conductivity type are introduced into the first semiconductor layer, and second impurities which have the same conductivity type as that of the first impurities and are different in properties from the first impurities are introduced into the second semiconductor film.

Incidentally, it is preferable that the first and second semiconductor films are polycrystalline silicon films, and arsenic is introduced into the first semiconductor film and phosphorus is introduced into the second semiconductor film.

A method of manufacturing a semiconductor memory according to the present invention may provide forming a first semiconductor film in such a way that the first semiconductor film contacts one of diffusion regions, introducing first impurities having a relatively small diffusion coefficient into the first semiconductor film, forming, after introducing the first impurities, a semiconductor film on the first semiconductor film, introducing second impurities having a relatively large diffusion coefficient into the second semiconductor film, and processing the first and second semiconductor films into a pattern of a lower electrode.

In the present invention, the lower electrode of the capacitor has the two-layer structure made of semiconductor, and the first impurities of one conductivity type are introduced into the first semiconductor layer, and the second impurities which have the same conductivity type as that of the first impurities and different different properties than the first impurities are introduced into the second semiconductor layer. Therefore, the impurities having a small diffusion coefficient such as arsenic are introduced into the first semiconductor film contacting one of the two diffusion regions of the transistor, whereby it is possible to prevent the degradation of the resistance to the soft error and the degradation of the characteristics of the access transistor. Also, the impurities having a large diffusion coefficient such as phosphorus are introduced into the second semiconductor film contacting the capacitor dielectric film, whereby it is possible to prevent the degradation of the film quality of the capacitor dielectric film.

DESCRIPTION OF THE PREFERRED EMBODIMENTS

Figure 1:
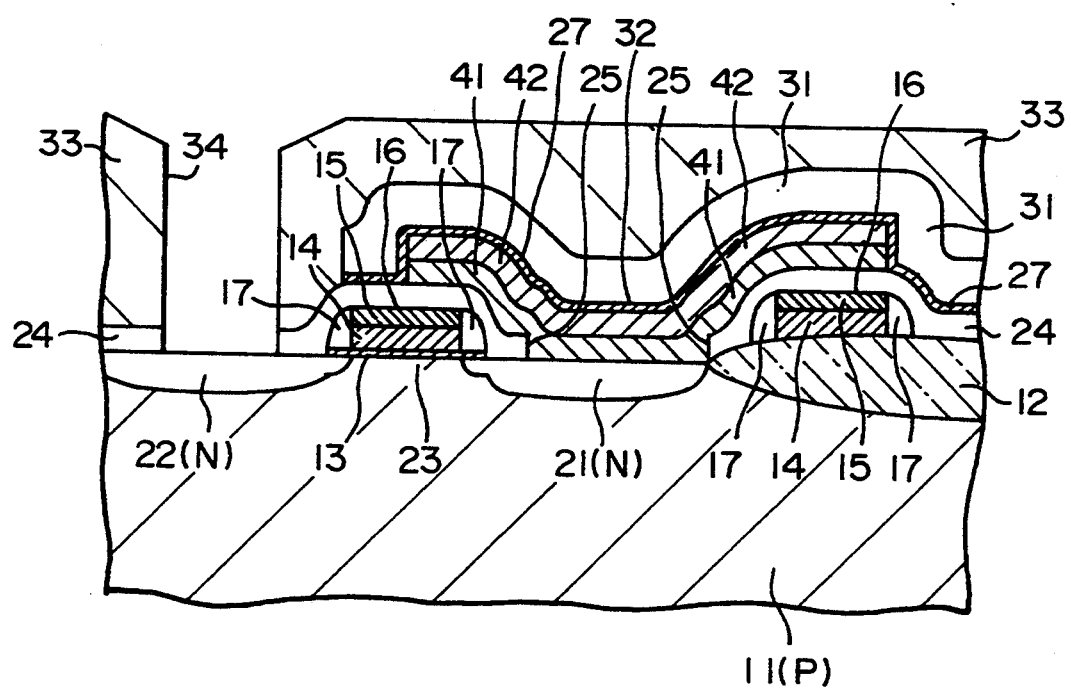
FIG. 1 is a cross sectional view showing a structure of a memory cell of stacked capacitor DRAM according to an embodiment of the present invention.

An embodiment in which the present invention is applied to stacked capacitor DRAM will hereinafter be described in detail with reference to FIG. 1 and FIGS. 2A–2H. In the embodiment shown in FIG. 1, those parts corresponding to their counter parts of the prior art in FIG. 3 are designated with the same reference numerals.

In the present invention, an $SiO_2$ film 12 with 400 to 500 nm thickness is selectively formed on a surface of a P type Si substrate 11 to form a field region, and then an $SiO_2$ film 13 with 10 to 30 nm thickness as a gate oxide film is formed on a surface of an active region. Then, a polycide film 16 consisting of a polycrystalline Si film 14 with 100 to 200 nm thickness and a $WSi_x$ film 15 with 100 to 200 nm thickness is patterned on the $SiO_2$ films 13 and 12 to form a gate electrode, i.e., a word line (see FIG. 2A).

Next, after the same process as that of the above-mentioned prior art, an access transistor 12 having the LDD structure is formed. Thereafter, an interlayer insulating film 24 with 500 to 1000 nm thickness is deposited on the whole surface of the substrate body, and then a contact hole 25 is formed through the interlayer insulating film 24 so as to reach a diffusion region 21 (see FIG. 2B).

Then, a polycrystalline Si film 41 with 100 to 200 nm thickness is deposited on the whole surface of the substrate body so as to contact the diffusion region 21 through the contact hole 25. Next, arsenic ions are implanted into the polycrystalline Si film 41 at 50 to 100 keV with a dose of $1 \times 10^{14}$ to $1 \times 10^{16}$ cm$^{-2}$ in such a way that the polycrystalline Si film 41 has the arsenic concentration of $10^{19}$ to $10^{21}$ cm$^{-3}$ (see FIG. 2C).

Figure 2A:
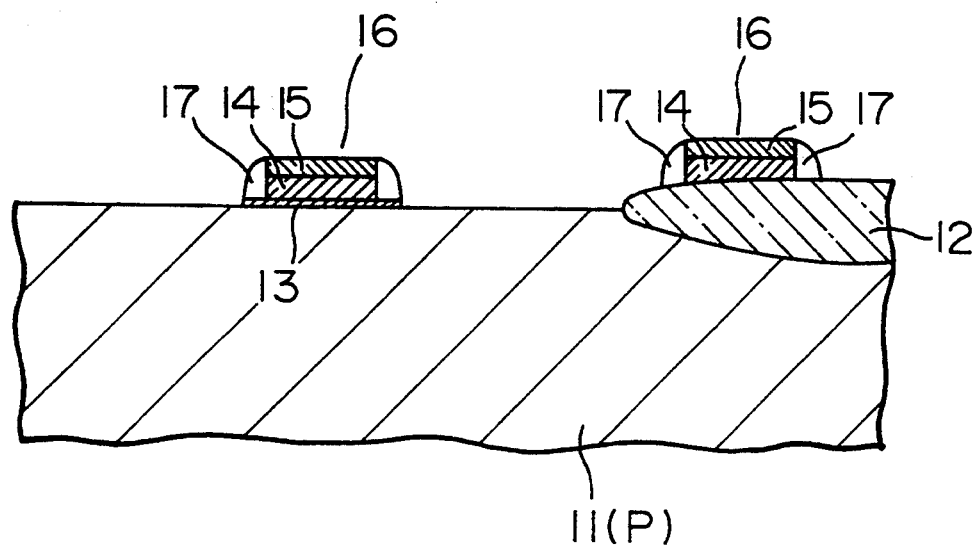
FIG. 2A is a cross sectional view showing a first step of fabrication of a memory cell of stacked capacitor DRAM according to the embodiment of the present invention.
Figure 2B:
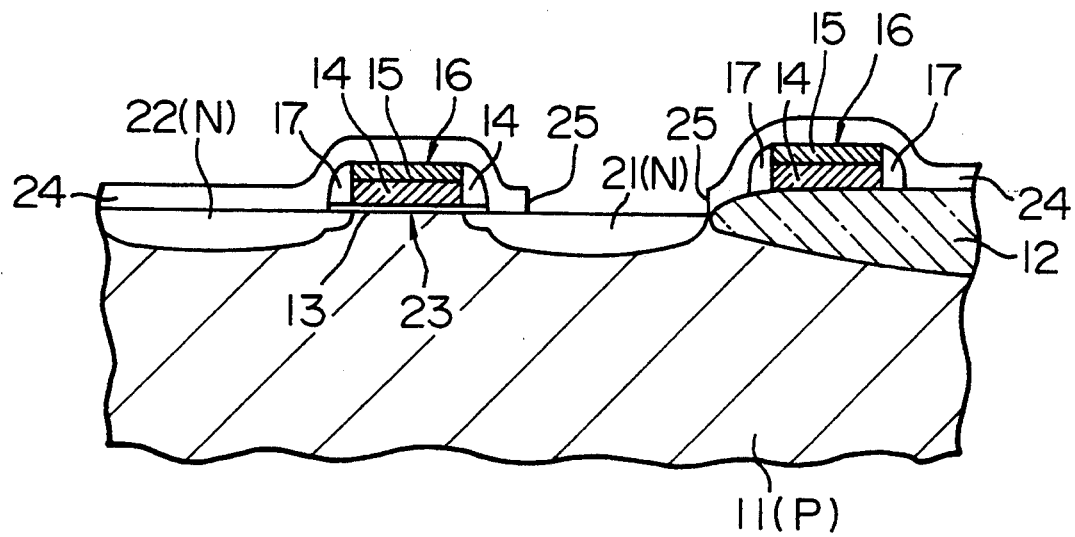
FIG. 2B is a cross sectional view showing a second step of fabrication of the memory cell of the invention.
Figure 2C:
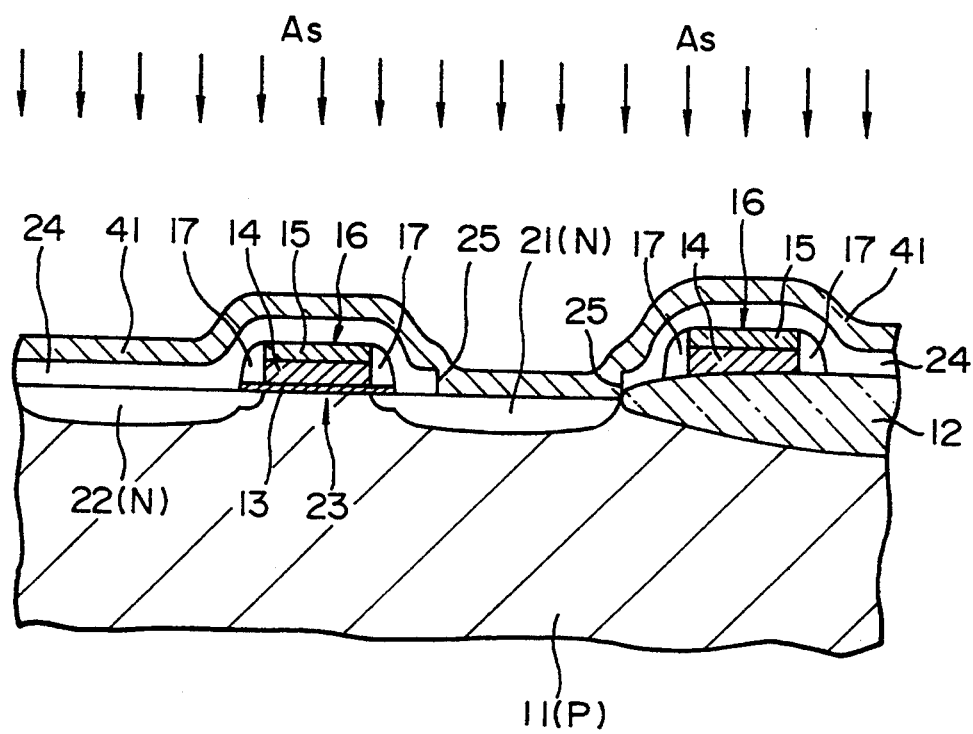
FIG. 2C is a cross sectional view showing a third step of fabrication of the memory cell of the invention.
Figure 2D:
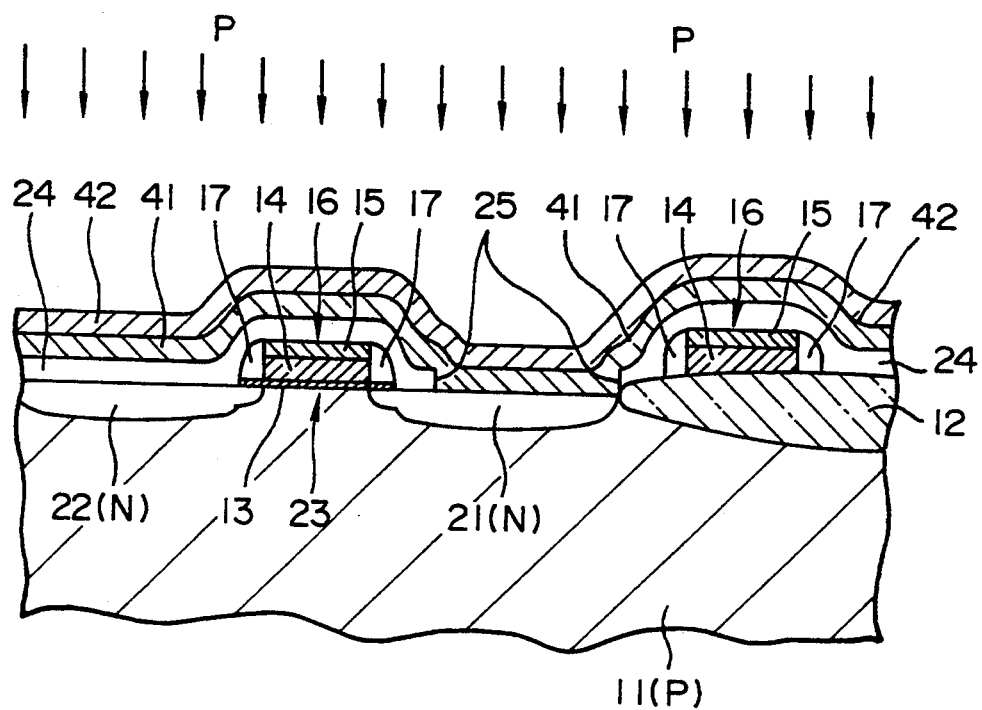
FIG. 2D is a cross sectional view showing a fourth step of fabrication of the memory cell of the invention.
Figure 2E:
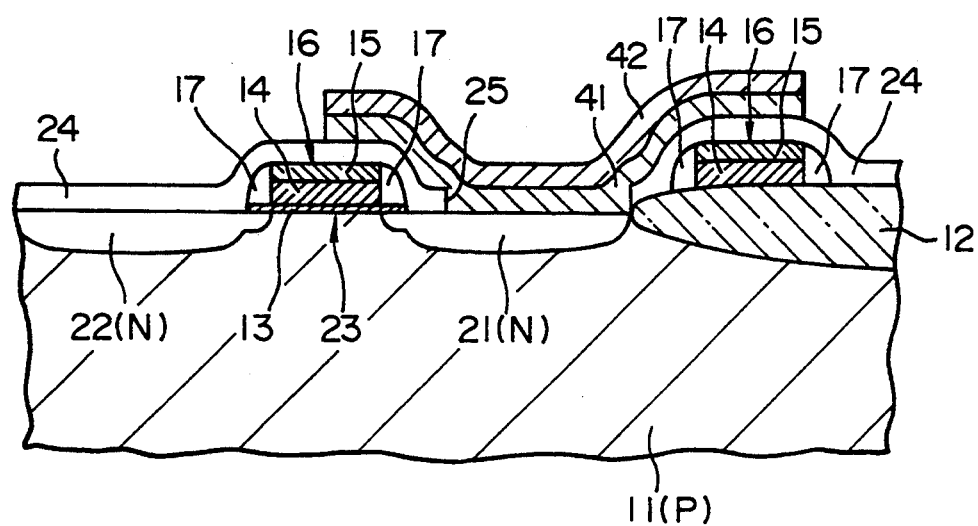
FIG. 2E is a cross sectional view showing a fifth step of fabrication of the memory cell of the invention.
Figure 3:
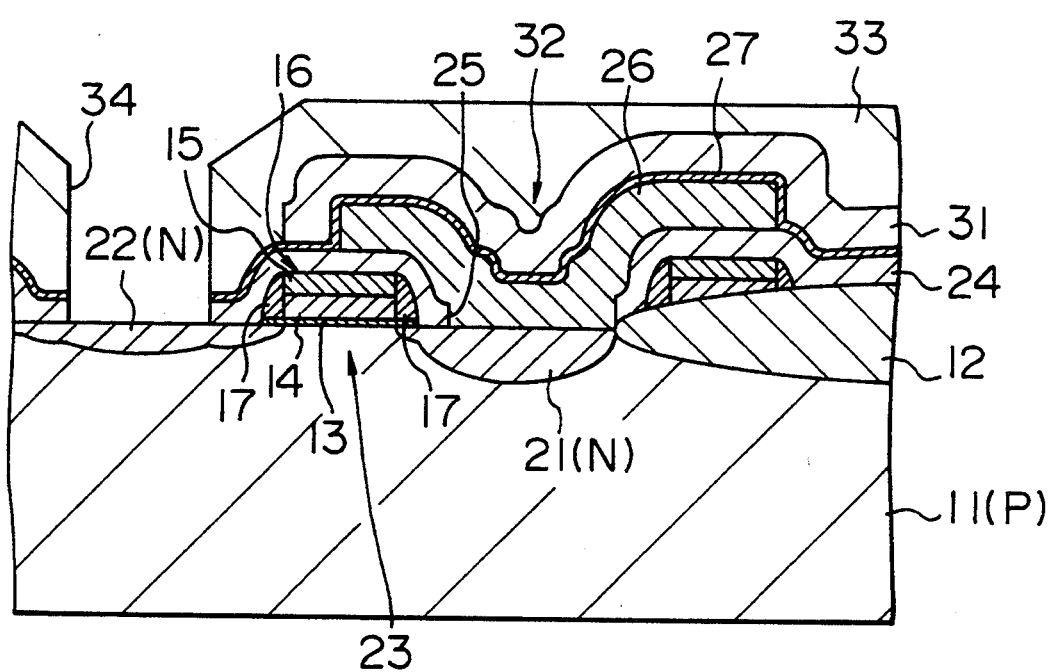
FIG. 3 is a cross sectional view showing a structure of a memory cell of the prior art stacked capacitor DRAM.

Thereafter, a polycrystalline Si film 42 with 100 to 200 nm thickness is deposited on the whole surface of the substrate body, and then phosphorus is diffused into the polycrystalline Si film 42 by the solid phase diffusion in such a way that the polycrystalline Si film 42 has the phosphorus concentration of $1 \times 10^{19}$ to $1 \times 10^{21}$ cm$^{-3}$ (see FIG. 2D). Then, the polycrystalline Si films 42 and 41 are processed into a pattern of a lower electrode (see FIG. 2E).

Figure 2F:
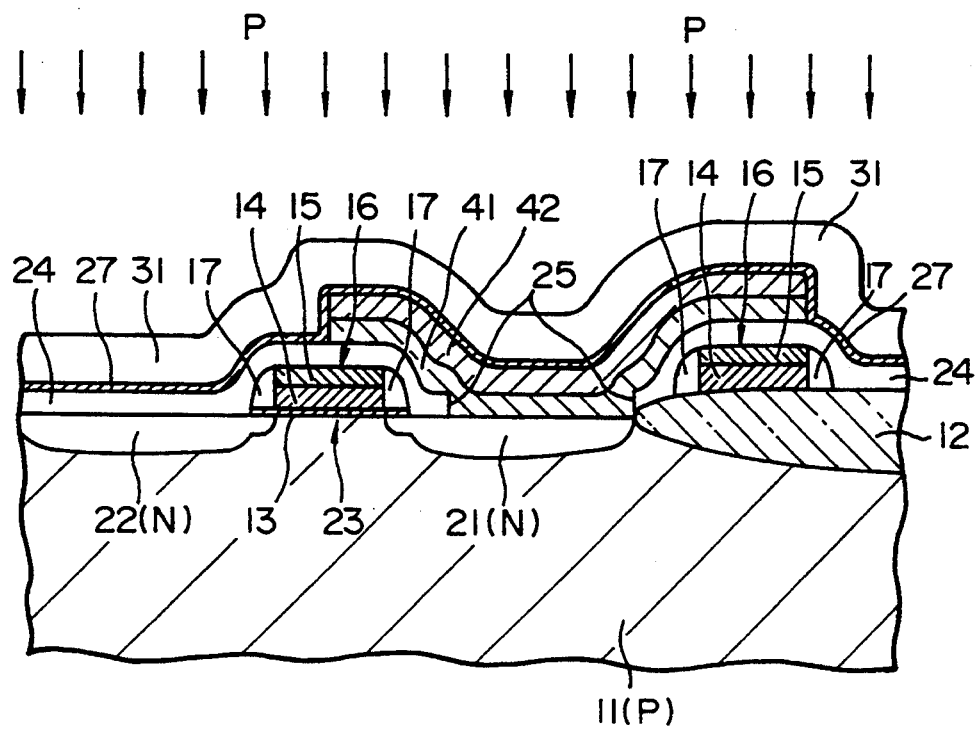
FIG. 2F is a cross sectional view showing a sixth step of fabrication of the memory cell of the invention.
Figure 2G:
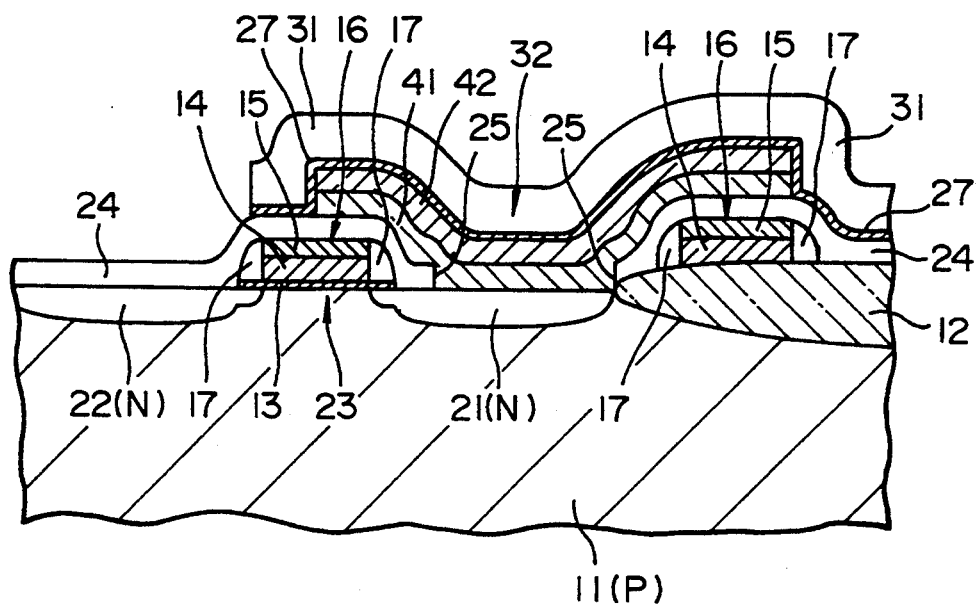
FIG. 2G is a cross sectional view showing a seventh step of fabrication of the memory cell of the invention.
Figure 2H:
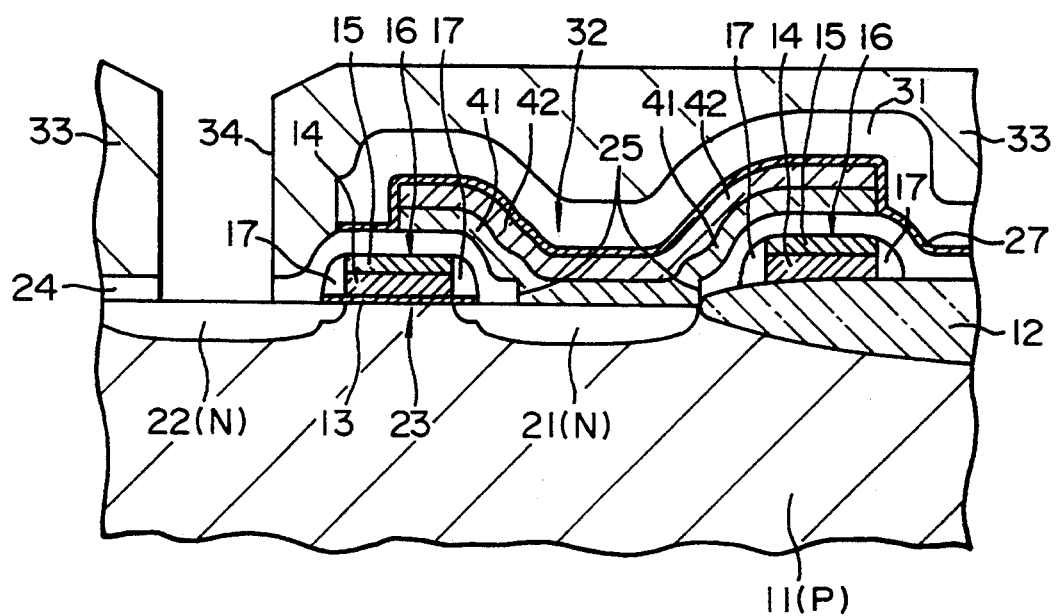
FIG. 2H is a cross sectional view showing a eighth step of fabrication of the memory cell of the invention.

Next, a capacitor dielectric film 27 such as an ONO film with 20 to 30 nm thickness, and a polycrystalline Si film 31 with 200 to 300 nm thickness are formed in this order on the whole surface of the substrate body, and then impurities are introduced into the polycrystalline Si film 31 (see FIG. 2F). Thereafter, the polycrystalline film 31 is processed into a pattern of an upper electrode. Up to this process, a stacked capacitor 32 is formed (see FIG. 2G). Thereafter, after the same process as that of the above-mentioned prior art, the stacked capacitor DRAM is completed (see FIG. 1 and FIG. 2H).

In the embodiment as described above, the diffusion coefficient of arsenic, the ions of which were implanted into the polycrystalline Si film 41, is small, and therefore it is possible to prevent the junction of the diffusion region 21 from becoming deep. Accordingly, it is possible to reduce the contact resistance of the lower electrode while preventing the degradation of the resistance to the soft error and the degradation of the characteristics of the access transistor 23.

On the other hand, the film contacting the capacitor dielectric film 27 is not the polycrystalline Si film 41 containing arsenic but the polycrystalline Si film 42 containing phosphorus. Therefore, it is possible to prevent the degradation of the film quality of the capacitor dielectric film 27.

According to the present invention, it is possible to prevent the degradation of the resistance to the soft error and the degradation of the characteristics of the transistor, and also to prevent the degradation of the film quality of the capacitor dielectric film.

I claim:

1. A semiconductor memory having a memory cell including a transistor having two diffusion regions and a capacitor having a lower electrode, wherein said lower electrode comprises:
   a first semiconductor film at which said lower electrode contacts one of said two diffusion regions, said first semiconductor having first impurities of one conductivity type introduced thereinto; and
   a second semiconductor film which is formed on said first semiconductor film, said second semiconductor film having second impurities introduced thereinto which have the same conductivity type as that of said first impurities and different physical properties than said first impurities.

2. The semiconductor memory according to claim 1, wherein a diffusion coefficient of said second impurities is larger than that of said first impurities.

3. The semiconductor memory according to claim 1, wherein said first semiconductor film is a polycrystalline film into which arsenic is introduced, and said second semiconductor film is a polycrystalline film into which phosphorus is introduced.

4. The semiconductor memory according to claim 3, wherein the concentration of arsenic contained in said first semiconductor film is in the range of $10^{19}$ to $10^{21}$ cm$^{-3}$, and the concentration of phosphorus contained in said second semiconductor film is in the range of $10^{19}$ to $10^{21}$ cm$^{-3}$.

5. The semiconductor memory according to claim 3, wherein arsenic is introduced into said first semiconductor film by the ion implantation, and phosphorus is introduced into said second semiconductor film by the solid phase diffusion.

6. A semiconductor memory having a memory cell including a transistor having two diffusion regions and a capacitor having a lower electrode, said lower electrode having a two-layer structure comprising:

a first layer made of a first semiconductor film and contacting one of said two diffusion regions, said first semiconductor film having first impurities of one conductivity type introduced thereinto; and a second layer made of a second semiconductor film formed on said semiconductor film and having second impurities introduced thereinto, said first and second impurities being of the same conductivity type but having different diffusion coefficients.

7. The semiconductor memory according to claim 6, wherein a diffusion coefficient of said second impurities is larger than that of said first impurities.

8. The semiconductor memory according to claim 6, wherein said first semiconductor film is a polycrystalline film into which arsenic is introduced, and said second semiconductor film is a polycrystalline film into which phosphorus is introduced.

9. The semiconductor memory according to claim 8, wherein the concentration of arsenic contained in said first semiconductor film is in the range of $10^{19}$ to $10^{21}$ cm$^{-3}$, and the concentration of phosphorus contained in said second semiconductor film is in the range of $10^{19}$ to $10^{21}$ cm$^{-3}$.

10. The semiconductor memory according to claim 8, wherein arsenic is introduced into said first semiconductor film by the ion implantation, and phosphorus is introduced into said second semiconductor film by the solid phase diffusion.

* * * * *